United States Patent [19]
Ikeda

[11] Patent Number: 4,853,761
[45] Date of Patent: Aug. 1, 1989

[54] SEMICONDUCTOR DEVICE

[75] Inventor: Shingo Ikeda, Itami, Japan

[73] Assignee: Mitsubishi Denki Kabushiki Kaisha, Tokyo, Japan

[21] Appl. No.: 25,824

[22] Filed: Mar. 13, 1987

[30] Foreign Application Priority Data

Mar. 14, 1986 [JP] Japan .................................. 61-57468

[51] Int. Cl.4 ...................... H01L 23/28; H01L 23/30
[52] U.S. Cl. ......................................... 357/72; 357/73
[58] Field of Search .................. 357/74 B, 73, 72, 23.6

[56]  References Cited
U.S. PATENT DOCUMENTS

| 4,001,872 | 1/1977 | Khajezadeh | 352/73 |
| 4,574,465 | 3/1986 | Rao | 357/23.6 |
| 4,630,095 | 12/1986 | Otsuka et al. | 357/73 |

FOREIGN PATENT DOCUMENTS

| 57-63831 | 4/1982 | Japan . | |
| 58-182837 | 10/1983 | Japan | 357/73 |
| 59-110174 | 6/1984 | Japan | 357/73 |
| 58-126645 | 1/1985 | Japan | 357/73 |
| 60-83337 | 5/1985 | Japan . | |
| 60-83338 | 5/1985 | Japan . | |
| 6083351 | 5/1985 | Japan . | |

Primary Examiner—Rolf Hille
Assistant Examiner—Gregory Key
Attorney, Agent, or Firm—Birch, Stewart, Kolasch & Birch

[57] ABSTRACT

A semiconductor device obtained by using plastic molding to obtain an ultraviolet ray erasable type EPROM semiconductor chip in which an ultraviolet ray transparent resin film is inserted between the semiconductor chip and the molding material so as to cover a portion of the surface or the whole surface of the semiconductor chip except for the surfaces of the wire bonding electrodes.

3 Claims, 2 Drawing Sheets

SEMICONDUCTOR DEVICE

FIELD OF THE INVENTION

The present invention relates to a semiconductor device, and more particularly to a semiconductor device including an ultraviolet ray erasable erasion type semiconductor memory device.

BACKGROUND ART

FIG. 3 shows a general chip construction of a semiconductor device including an ultraviolet ray erasable type semiconductor memory device.

In FIG. 3, the reference numeral 1 designates a semiconductor chip, the reference numeral 2a designates wire bonding electrodes provided on the semiconductor chip 1. The reference numeral 2b designates electrode windows, and the reference numeral 3 designates a protection film deposited on the surface of the semiconductor chip 1. This protection film 3 is a silicon nitride film, silicon dioxide film, or both. The reference numeral 4 designates a metal wire for connecting the wire bonding electrode 2a and a package terminal. The reference numeral 5 designates a transparent window of the package provided above the semiconductor chip 1. The reference numeral 6 designates a hollow section in which inactive gas is sealed.

In an integrated circuit element provided with such an ultraviolet ray erasable erasion type memory device, the upper layer protection film 3 and the transparent window 5 comprise material which is transparent to ultraviolet rays. Accordingly, with this device a reading out operation is conducted by providing a cover (not shown) above the transparent window 5 to cut off the ultraviolet rays, and a memory erasing operation is conducted by irradiating ultraviolet rays on to the device from an outside source with the cover removed.

The above-described integrated circuit element has an ultraviolet ray erasable type element construction by which erasing and writing can be conducted at desired times repeatedly, and an element oriented to conduct only the writing function with no erasing function can be also combined together with the above-described element on the same chip. This writing function oriented element is designed to be used with a chip which includes an ultraviolet ray erosion type memory device and is constructed such that a writing operation can be conducted only one time and the memory content can not be erased thereafter. An element having this construction is called an "OTP" (One Time Programmable semiconductor element). FIG. 4 shows a brief construction of such an element, wherein the reference numeral 7 designates molding material. This semiconductor element is constructed by using a cheaper molding package than that having a transparent window as shown in FIG. 3. This device does not have a hollow section such as 6 of the device of FIG. 3, and the molding material and the semiconductor chip are disposed so as to be in contact with each other.

The prior art OTP is constructed in such a manner, and has an advantage of low cost. However, since the package molding material and the semiconductor chip are provided in contact with each other in this prior art OTP, the OTP is likely to include defects after construction due to the pressure of the molding material, the local stresses applied to the semiconductor chip by the fillers, and the difference in the thermal expansion properties between the upper layer protection film of the semiconductor chip and the molding material. Furthermore, it is difficult or impossible to conduct tests and remove faulty devices after construction.

SUMMARY OF THE INVENTION

An object of the present invention is to provide a highly reliable semiconductor device which does not include defects after construction.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semicondcutor device which is obtained by plastic molding of an ultraviolet ray erasable type EPROM semiconductor chip in which an ultraviolet ray transparent resin film is inserted between the semiconductor chip and the molding material so as to cover a portion of the surface or the whole surface of the semicondcutor chip except for the surfaces of the wire bonding electrodes.

DETAILED DESCRIPTION OF THE PREFERRED EMBODIMENTS

Figure 1:
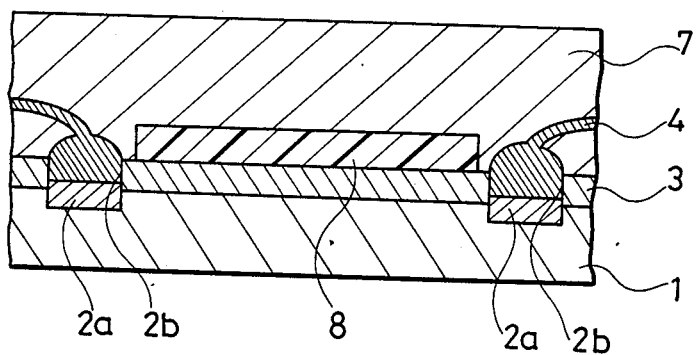
FIG. 1 is a cross-sectional view showing a semiconductor device as an embodiment of the present invention.

In order to explain the present invention in detail, reference will be particularly made to FIG. 1.

FIG. 1 shows a construction of a semiconductor device as an embodiment of the present invention. In FIG. 1, the reference numeral 1 designates a semiconductor chip, the reference numeral 2a designates wire bonding electrodes, the reference numeral 2b designates electrode windows, the reference numeral 3 designates a protection film deposited on the surface of the semicondcutor chip 1, the reference numeral 4 designates a metal wire for connecting the wire bonding electrode 2a and a package terminal. The reference numeral 7 designates package molding material, the reference numeral 8 designates an ultraviolet ray transparent type resin film deposited on the surface of the surface protection film 3.

A method of producing this semiconductor device will be described.

A surface protection film 3 is produced on the semiconductor wafer (semiconductor chip 1), an electrode window 2b is formed, and an ultraviolet ray transparent type polyimide film 8 is formed on the wafer uniformly by rotatory application. Thereafter, the polyimide resin film 8 is formed in a desired pattern by usual photolithography techniques, and ultraviolet rays are irradiated on the semiconductor chip 1 to erase the memory content, and thereafter the whole device is sealed in plastic with the molding material 7 to complete the construction of the semiconductor chip 1.

In this semiconductor device the ultraviolet ray transparent type resin film 8 becomes a buffer section for local stresses which arise between the semiconductor chip 1 and the molding material 7. Thus, it is possible to prevent the production of faulty semiconductor elements by buffering the stresses between the molding material 7 and the semiconductor chip 1 and the local stresses due to the molding material which arise after the construction of the mold package. Further, it is also possible to obtain a moisture-proof mold package device. Furthermore, since the buffer resin is transparent to ultraviolet erasure of the memory chip content can be conducted by the irradiation of ultraviolet rays after the resin film is formed on the semiconductor chip.

The ultraviolet ray transparent type resin film is desirably provided on regions where elements such as a transistor or a memory cell are provided because these regions are weak compared to other regions where wirings are provided. Especially, regions where differential amplifiers are provided are to be protected by such resin films because the whole characteristics of the differential amplifiers are determined dependent on the balance of the characteristics of a plurality of transistors constituting the amplifiers, which balance is likely to vary due to the stresses.

Figure 2:
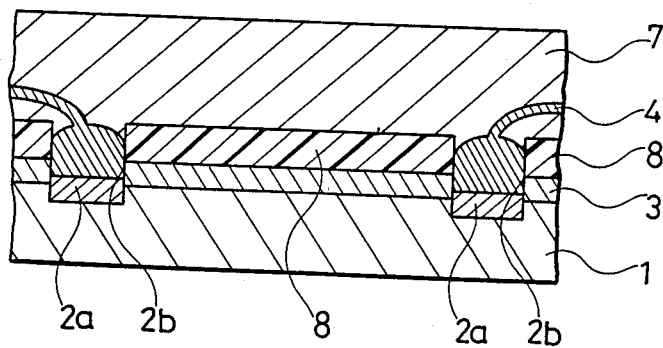
FIG. 2 is a cross-sectional view showing another embodiment of the present invention.
Figure 3:
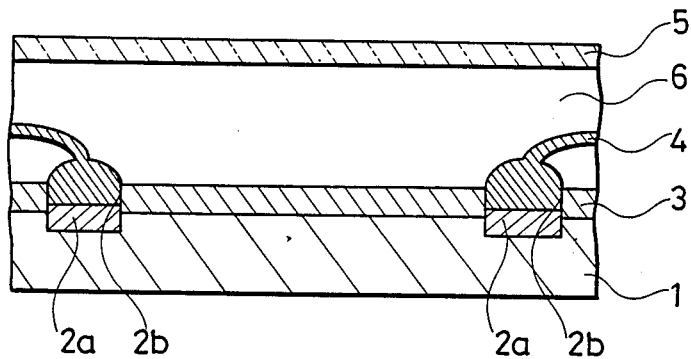
FIG. 3 is a cross-sectional view showing a prior art ultraviolet ray erasable type semiconductor device which provides for repetative erasing.
Figure 4:
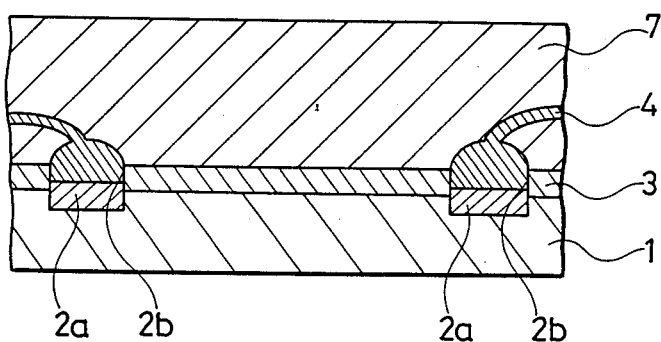
FIG. 4 is a cross-sectional view showing a prior art OTP.

FIG. 2 shows another embodiment of the present invention. In this embodiment the ulraviolet ray transparent resin film is provided on the entire surface of the semiconductor chip except for the surfaces of the wire bonding electrodes.

The polyimide film 8 which is used as ultraviolet ray transparent resin film in the above-illustrated embodiment can be replaced by any resin which has required hardness and is transparent to ultraviolet rays with the same effects as described above.

A desired pattern of the ultraviolet ray transparent resin film is obtaiend by photolithography in the above-illustrated embodiment, but this desired pattern can be formed by other methods which provide for a uniform resin film thickness pattern.

As is evident from the foregoing description, according to the present invention an ultraviolet ray transparent type resin is deposited on a semiconductor chip including an ultraviolet ray erasable type memory, and the whole device is sealed with plastic. This allows for the erasing of memory content directly before the sealing process of the semiconductor chip, which arises no defects after the construction, resulting in a high reliable and low cost semiconductor device.

What is claimed is:

1. A plastic molded ultraviolet ray erasable type EPROM semiconductor device which comprises:
   a semiconductor chip having an element region;
   wire bonding electrodes operatively connected to said semiconductor chip;
   a surface protection film formed on said semiconductor chip;
   an ultraviolet ray transparent resin film comprising polyimide formed on said surface protection film so as to cover at least said element region and the surface of said semiconductor chip except for said wire bonding electrodes; and
   molding material formed on said resin film, said wire bonding electrodes, and said surface protection film so as to cover said semiconductor chip, wherein said EPROM semiconductor device is one time programmable so as to have one time only erasing and writing functions, and wherein said resin film reduces stresses arising between said semiconductor chip and said molding material.

2. A semiconductor device as defined in claim 1, further comprising a differential amplifier disposed on said element region of said semiconductor chip.

3. A semiconductor device as defined in claim 2, wherein said semiconductor chip includes electrode windows formed therein so as to provide for said wire bonding electrodes.

* * * * *